(12) United States Patent
Lu et al.

(10) Patent No.: US 6,749,398 B2
(45) Date of Patent: Jun. 15, 2004

(54) HOT SWAP FAN TRAY WITH FAN GUARD

(75) Inventors: Chow-Wen Lu, Taoyuan Hsien (TW); Te-Tsai Chuang, Miaoli Hsien (TW); Chao-Wu Wen, Taoyuan Hsien (TW); Wen-Shi Huang, Taoyuan Hsien (TW)

(73) Assignee: Delta Electronics Inc., Taoyuan Sien (TW)

( * ) Notice: Subject to any disclaimer, the term of this patent is extended or adjusted under 35 U.S.C. 154(b) by 0 days.

(21) Appl. No.: 10/419,081

(22) Filed: Apr. 21, 2003

(65) Prior Publication Data

US 2003/0185670 A1 Oct. 2, 2003

Related U.S. Application Data

(63) Continuation of application No. 09/924,533, filed on Aug. 9, 2001, now Pat. No. 6,579,062.

(30) Foreign Application Priority Data

Nov. 16, 2000  (TW) ........................................ 89219862 U

(51) Int. Cl.⁷ ............................................. F01D 25/00
(52) U.S. Cl. ................. 415/121.2; 415/213.1; 416/247 R; 29/889.1
(58) Field of Search .................... 415/121.2, 213.1, 415/214.1, 220, 223, 177, 178, 119, 222; 416/247 R, 24, 244 R; 174/35 R; 454/184; 29/889.1, 889.12, 889.2

(56) References Cited

U.S. PATENT DOCUMENTS

| | | | | |
|---|---|---|---|---|
| 2,322,656 A | * | 6/1943 | Murphy | |
| 2,327,328 A | * | 8/1943 | Murphy | |
| 2,329,688 A | * | 9/1943 | Bedford, Jr. et al. | |
| 4,103,400 A | * | 8/1978 | Munse | 24/73 MF |
| 4,363,839 A | * | 12/1982 | Watanabe et al. | 428/31 |
| 4,721,473 A | * | 1/1988 | DelGuidice et al. | 439/79 |
| 5,108,239 A | * | 4/1992 | Clinch | 411/175 |
| 5,231,246 A | * | 7/1993 | Benson et al. | 174/35 R |
| 5,233,507 A | | 8/1993 | Gunther et al. | |
| 5,407,364 A | * | 4/1995 | Tzeng et al. | 439/567 |
| 5,590,025 A | * | 12/1996 | Clemens | 361/695 |
| 5,596,170 A | | 1/1997 | Barina et al. | |
| 5,652,695 A | * | 7/1997 | Schmitt | 361/685 |
| 5,770,822 A | | 6/1998 | Abolitz et al. | |
| 5,788,566 A | | 8/1998 | McAnally et al. | |
| 6,017,185 A | * | 1/2000 | Kuo | 415/177 |
| 6,051,780 A | | 4/2000 | Fuhrmann et al. | |
| 6,328,529 B1 | | 12/2001 | Yamaguchi et al. | |
| 6,353,981 B1 | * | 3/2002 | Smith | 24/295 |
| 6,375,440 B2 | * | 4/2002 | Kosugi | 417/423.14 |

* cited by examiner

Primary Examiner—Edward K. Look
Assistant Examiner—J. M. McAleenan
(74) Attorney, Agent, or Firm—Birch, Stewart, Kolasch & Birch, LLP

(57) ABSTRACT

A hot swap fan tray with fan guard is disclosed. The present invention includes a frame, at least one fan and at least one fan guard. The frame includes a plurality of first holes. The fan includes a plurality of second holes. The fan guard further includes a plane and at least one protrusive terminal. The protrusive terminal projects from the plane and includes at least one bend. During the protrusive terminal passes through the first hole and the second hole, the bend changes shape and then returns original shape elastically, thereby the bend attaching said fan and said fan guard to said frame.

8 Claims, 7 Drawing Sheets

HOT SWAP FAN TRAY WITH FAN GUARD

This application is a continuation of application Ser. No. 09/924,533, filed on Aug. 9, 2001 now U.S. Pat. U.S. Pat. No. 6,579,062, the entire contents of which are hereby incorporated by reference and for which priority is claimed under 35 U.S.C. §120; and this application claims priority of Application No. 089219862 filed in Taiwan, R.O.C. on Nov. 16, 2000 under 35 U.S.C. §119.

BACKGROUND OF THE INVENTION

1. Field of the Invention

The present invention relates to a fan tray with fan guard, and more particularly to a hot swap fan tray with fan guard.

2. Description of the Prior Art

The so-called fan tray includes several fans mounted in a frame. As some fan has a breakdown, the built-in control circuit starts or accelerates the remaining fans to compensate the reduced cooling ability.

As partially shown in FIG. 1, the conventional fan tray 10 includes frame 20, a fan 30, a fan guard 50 and a plurality of screws 60. Among these, the frame 20 includes a plurality of first holes 25. The fan 30 includes a plurality of second holes 35 corresponding to the first holes 25.

Still referring to FIG. 1, the conventional fan guard 50 is made of metallic mesh. The conventional fan guard 50 has the extending portions 57 extending from the plane 55. Besides, the extending portions 57 are aligned to the first holes 25 and the second holes 35. However, the conventional fan tray 10 suffers from the problems that the fan 30 and fan guard 50 are difficult to assembly and disassembly. During assembling, the screws 60 passing through the extending portions 57, the first holes 25 and the second holes 35 screw the fan 30 and the fan guard 50 to the frame 20. During disassembling, it is time-consuming to screw the screws 60 off the frame 20 to separate the fan 30 and the fan guard 50 from the frame 20.

Therefore, there is a need in the art for a hot swap fan tray with fan guard which dose not require any screw attaching the fan 30 and the fan guard 50 to the frame 20.

SUMMARY OF THE INVENTION

Therefore, the main object of the present invention is to provide a hot swap fan tray and fan guard.

A more specific object of the present invention to provide a fan tray which does not require any screw attaching fan and fan guard to the fan tray.

The present fan tray includes a frame, at least one fan and at least one fan guard. Among these, the frame includes a plurality of first holes. The fan includes a plurality of second holes. The fan guard is capable of hot swap. The fan guard further includes a plane and at least one protrusive terminal. The protrusive terminal projects from the plane and includes at least one bend, such as the first bend and the second bend.

The bend is formed by bending the metal wire constituting the plane. Besides, the bend may be bent toward the same or different direction if the number of the bend is more than one. For example, the first bend is bent toward the center of the plane and the second bend is bent toward the direction opposite to the center of the plane. Alternatively, the first bend is bent along some tangent line of the plane and the second bend is bent opposite to the direction of the tangent line. In addition, the first bend and the second bend are continuous or discontinuous to each other.

During assembling, the protrusive terminal passes through the first hole and the second hole, thereby the elastic bend attaching the fan and the fan guard to the frame. Since the bend is elastic, the first bend and the second bend can pass through the first hole and the second hole. Then, the first bend and the second bend return to original shape due to elasticity after passing through the first hole and the second hole. In this manner, the first bend and the second bend attach the fan and the fan guard to the frame. During disassembling, the first bend and the second bend are pulled and compressed so as to disconnect the fan guard from the frame.

It is noted that the present fan guard permits of directly attaching to the fan by means of the protrusive terminal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The First Embodiment

Figure 1:
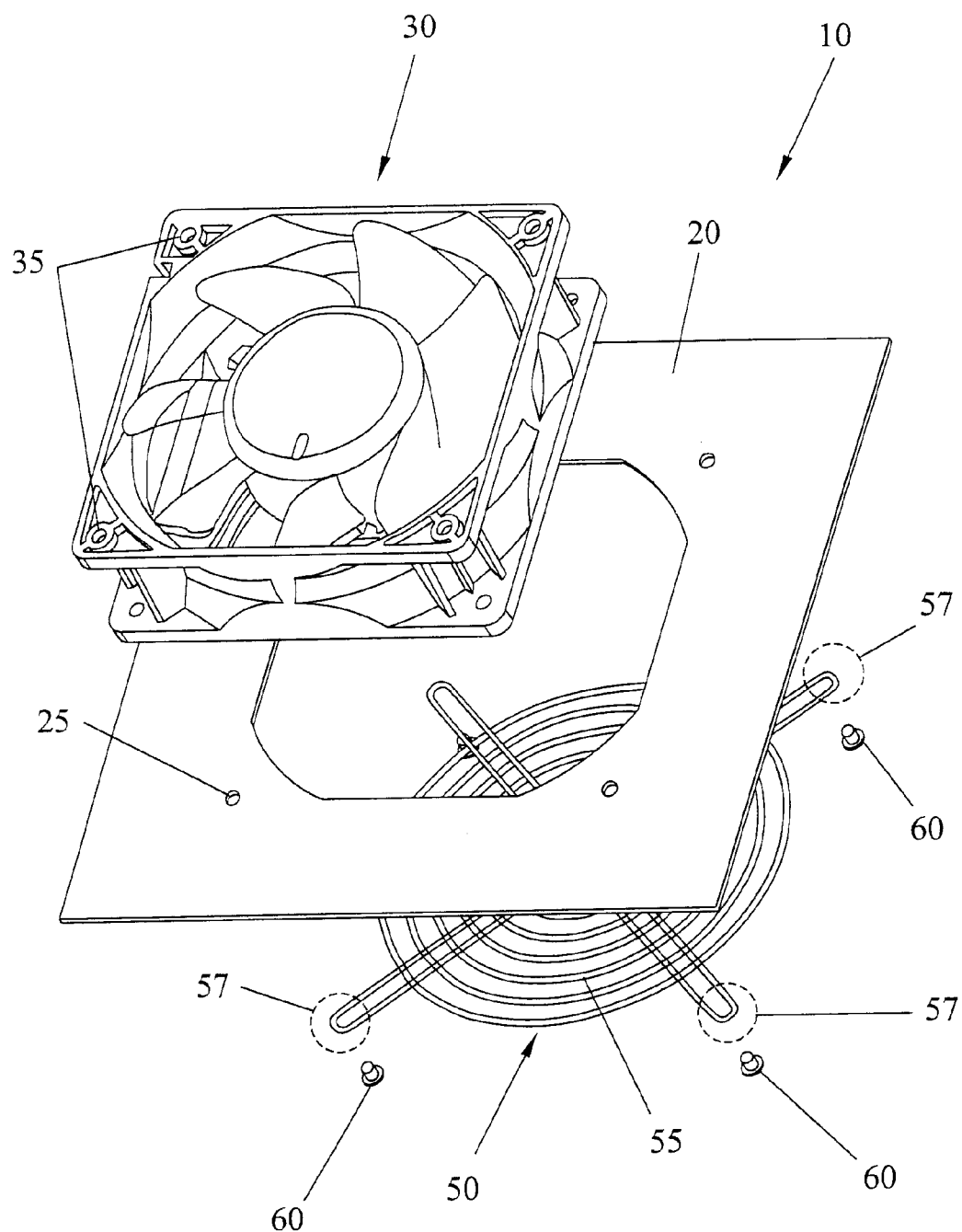
FIG. 1 shows a conventional fan tray.
Figure 2:
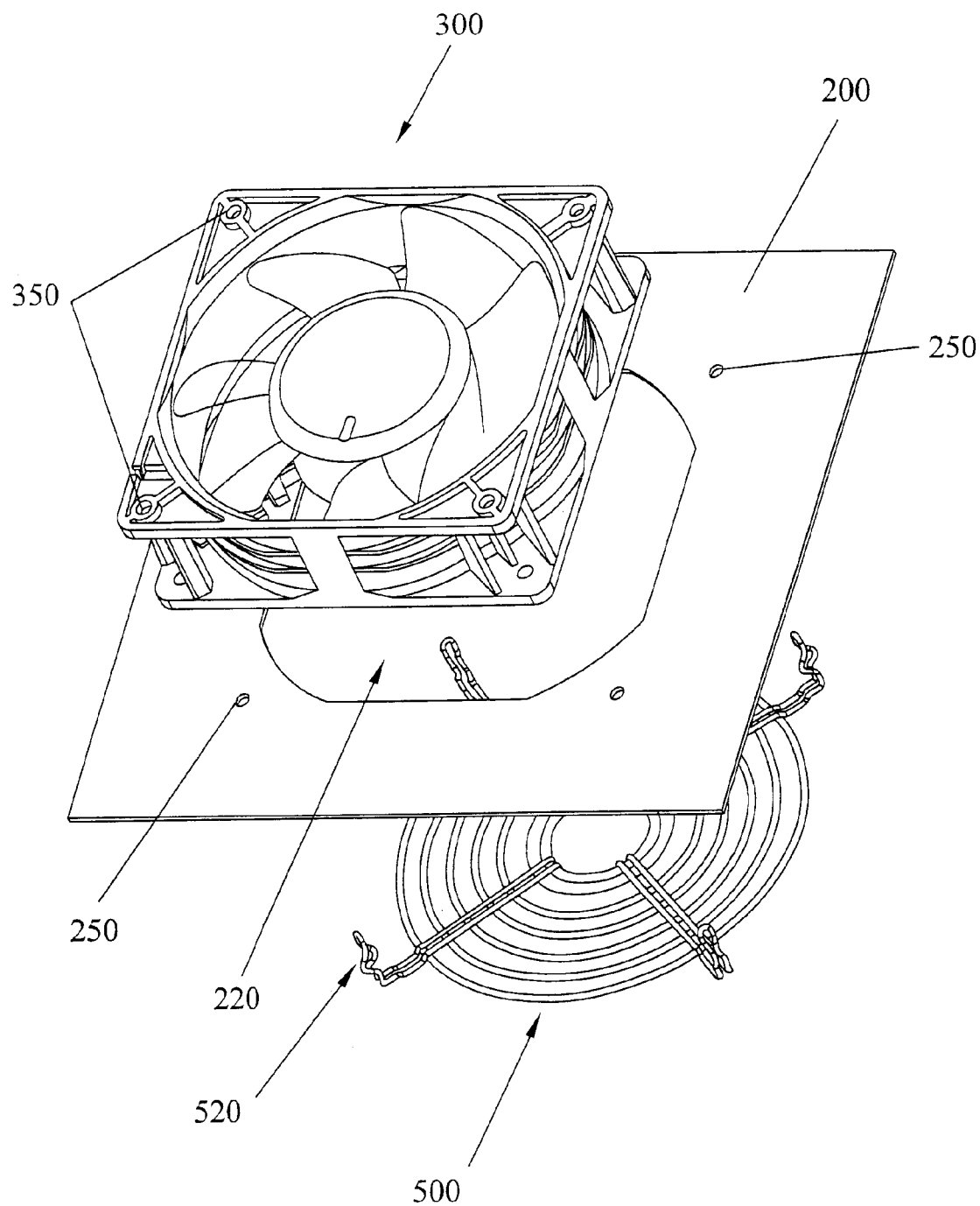
FIG. 2 shows a part of the fan tray according to the present invention.

According to the first embodiment of the present invention shown in FIG. 2, the hot swap fan tray includes a frame 200, at least one fan 300 and at least one fan guard 500. Among these, the frame 200 includes at least one opening 220 and a plurality of first holes 250. The fan 300 includes a plurality of second holes 350, such as the second holes 350 formed on the periphery of the fan 300. Besides, the present invention does not require the specific fan. That is, a general fan already in existence may be used as the present fan 300 to reduce cost.

Figure 3A:
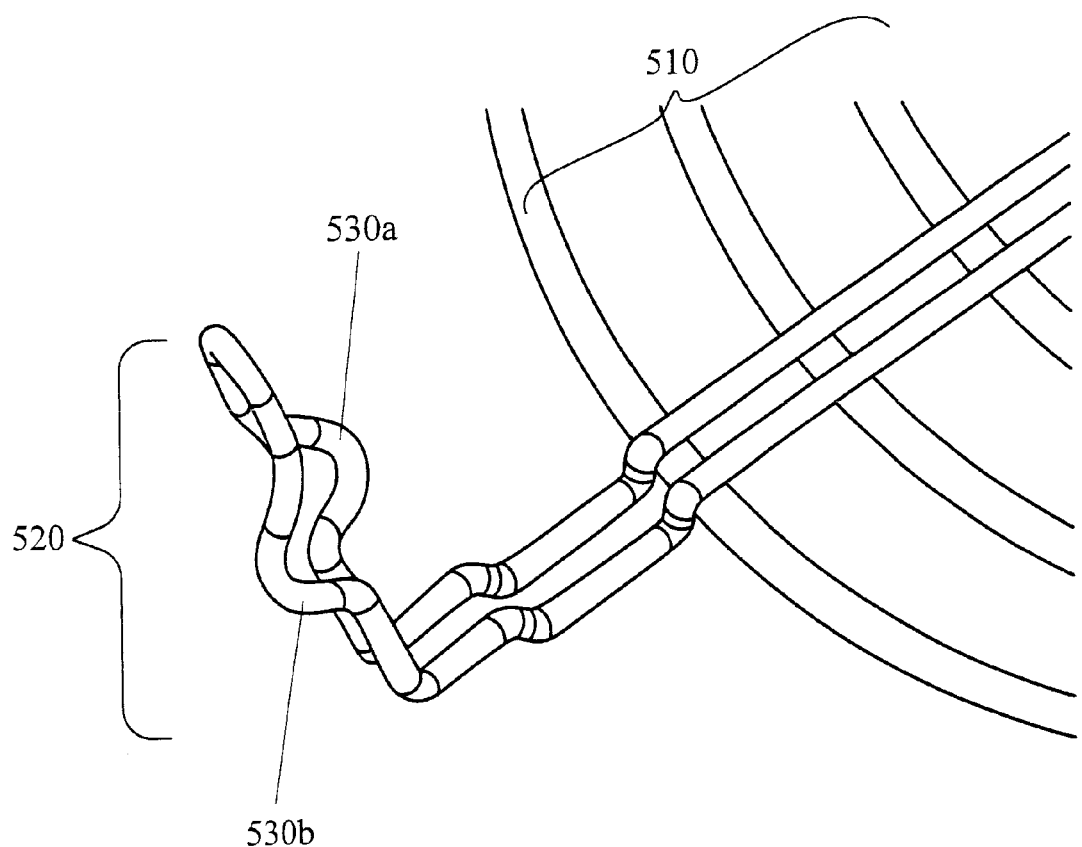
FIGS. 3(a)–3(c) show the embodiments of the fan tray according to the present invention.

Referring to FIG. 2 and FIG. 3(a), the fan guard 500 is capable of hot swap. The fan guard 500 further includes a plane 510 and at least one protrusive terminal 520. The protrusive terminal 520 projects from the plane 510 and further includes at least one bend, such as the first bend 530a and the second bend 530b. Due to the bend, the protrusive terminal 520 can return original shape elastically after compressed.

Figure 3B:
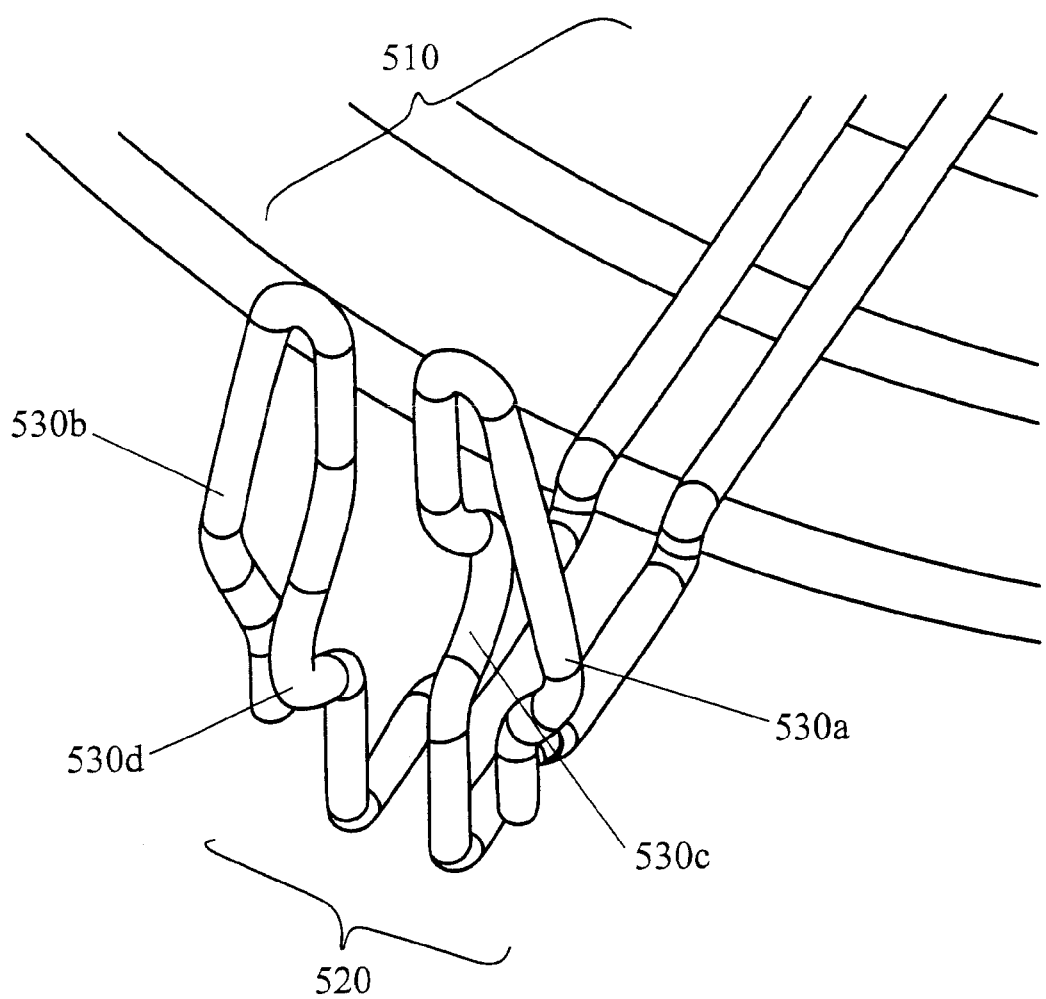
Figure 3C:
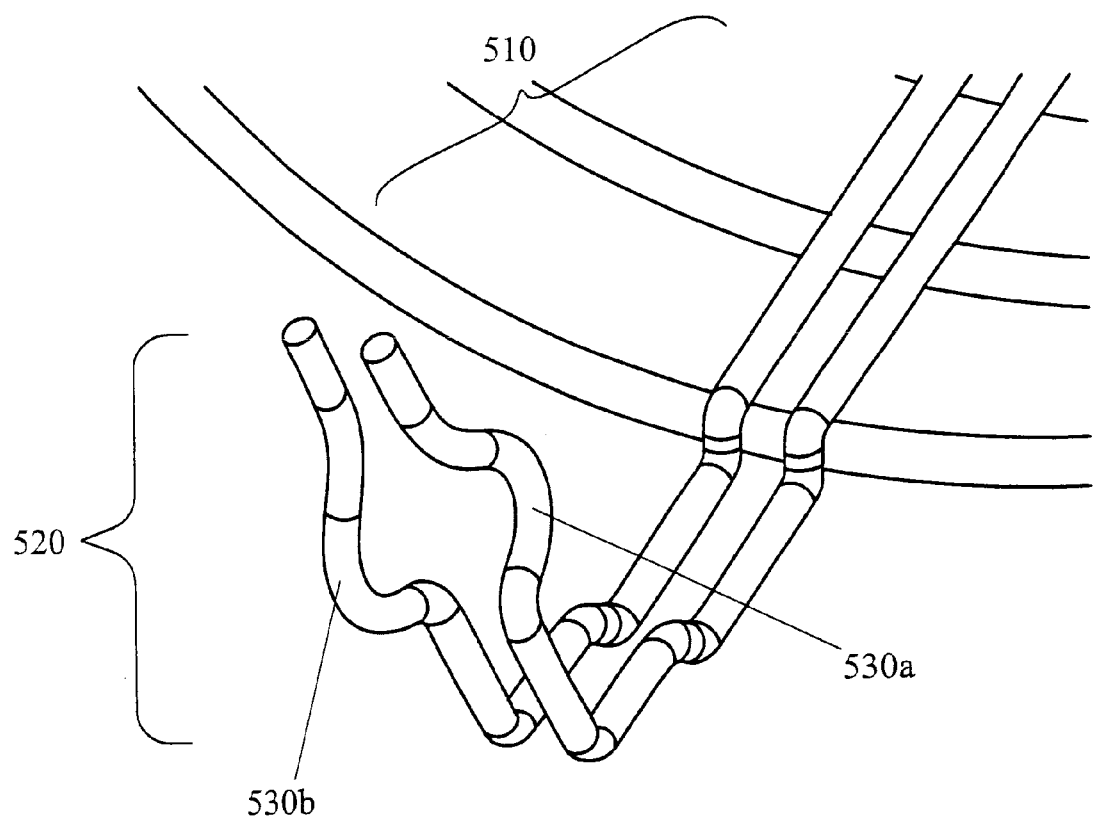

Refer to FIGS. 3(a)–(c) illustrating the bends according to the several embodiments of the present invention. The following embodiments differ from each other in the number of the bend and the bending direction. The bend 530 is formed by bending the metal wire constituting the plane 510. Besides, the bends 530 (i.e. 530a and 530b) may be bent toward the same or different direction if the number of the bend is more than one.

As the embodiment shown in FIG. 3(a), the protrusive terminal 520 has two bends including the first bend 530a and the second bend 530b. Among these, the first bend 530a is bent toward the center of the plane 510 and the second bend 530b is bent toward the direction opposite to the center of the plane 510.

Alternatively, as the embodiment shown in FIG. 3(b), the protrusive terminal 520 has four bends including the first bend 530a, the second bend 530b, the third bend 530c and the fourth bend 530d. Among these, the first bend 530a is bent along some tangent line of the plane 510 and the second bend 530b is bent opposite to the direction of the tangent line. Further, the third bend 530c is bent toward the center of the plane 510 and the third bend 530d is bent toward the direction opposite to the center of the plane 510. In addition, the first bend 530a and the second bend 530b are continuous, as shown in FIG. 3(a) and FIG. 3(b), or discontinuous to each other as shown in FIG. 3(c).

Refer to FIG. 2 and FIG. 3(a)–FIG. 3(c). During assembling, the protrusive terminal 520 passes through the first hole 250 and the second hole 350, the bends elastically deforming and then returning original shape, thereby the bend attaching the fan 300 and the fan guard 500 to the frame 200. Besides, the inlet or outlet of the fan 300 is aligned to the opening 220 of the frame 200. Since the bend is elastic, the compressed and deformed bends, such as the first bend 530a and the second bend 530b, can pass through the first hole 250 and the second hole 350. Then, the first bend 530a and the second bend 530b return to original shape due to elasticity after passing through the first hole 250 and the second hole 350. In this manner, the first bend 530a and the second bend 530b attach the fan 300 and the fan guard 500 to the frame 200. During disassembling, the first bend 530a and the second bend 530b are pulled and compressed so as to disconnect the fan guard 500 from the frame 200.

It is noted that the present fan guard permits of directly attaching to the fan by means of the protrusive terminal. As shown in FIG. 2 and FIG. 3(a), the protrusive terminal 520 passes through the second hole 350 of the fan 300 so as to directly attach the fan guard 500 to the fan 300. Since the bend is elastic, the compressed and deformed bends, such as the first bend 530a and the second bend 530b, can pass through the second hole 350. Then, the first bend 530a and the second bend 530b return to original shape due to elasticity after passing through the second hole 350. In this manner, the first bend 530a and the second bend 530b attach the fan guard 500 to the fan 300. During disassembling, the first bend 530a and the second bend 530b are pulled and compressed so as to disconnect the fan guard 500 from the fan 300.

The Second Embodiment

Figure 5:
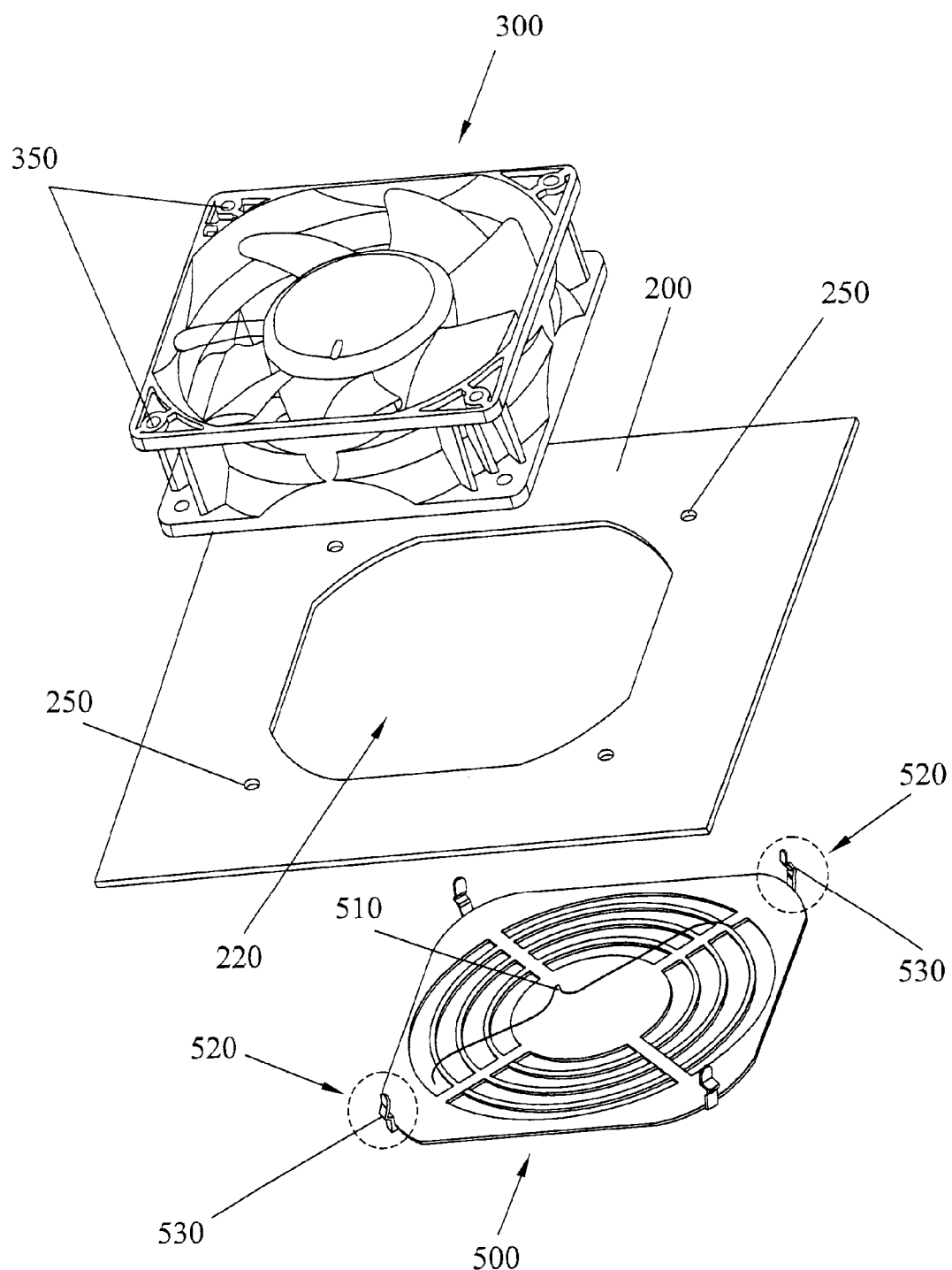
FIG. 5 also shows another embodiment of the fan tray according to the present invention.

According to the second embodiment of the present invention shown in FIG. 5, the hot swap fan tray includes a frame 200, at least one fan 300 and at least one fan guard 500. Among these, the frame 200 includes at least one opening 220 and a plurality of first holes 250. The fan 300 includes a plurality of second holes 350, such as the second holes 350 formed on the periphery of the fan 300. Besides, the present invention does not require the specific fan. That is, a general fan already in existence may be used as the present fan 300 to reduce cost.

Still referring to FIG. 5, the fan guard 500 is formed by punching a metal sheet and thus has a sheet metal construction. The fan guard 500 is capable of hot swap. The fan guard 500 further includes a plane 510 and at least one protrusive terminal 520. The protrusive terminal 520 projects from the plane 510 and includes at least one bend, such as the first bend 530a and the second bend 530b. Due to the bend, the protrusive terminal 520 can return original shape elastically after compressed. During assembling, the bend 530 of the protrusive terminal 520 passes through the first hole 250 and the second hole 350, the bends elastically deforming and then returning original shape, thereby the bend 530 attaching the fan 300 and the fan guard 500 to the frame 200. Besides, the inlet or outlet of the fan 300 is aligned to the opening 220 of the frame 200.

The Third Embodiment

Figure 4:
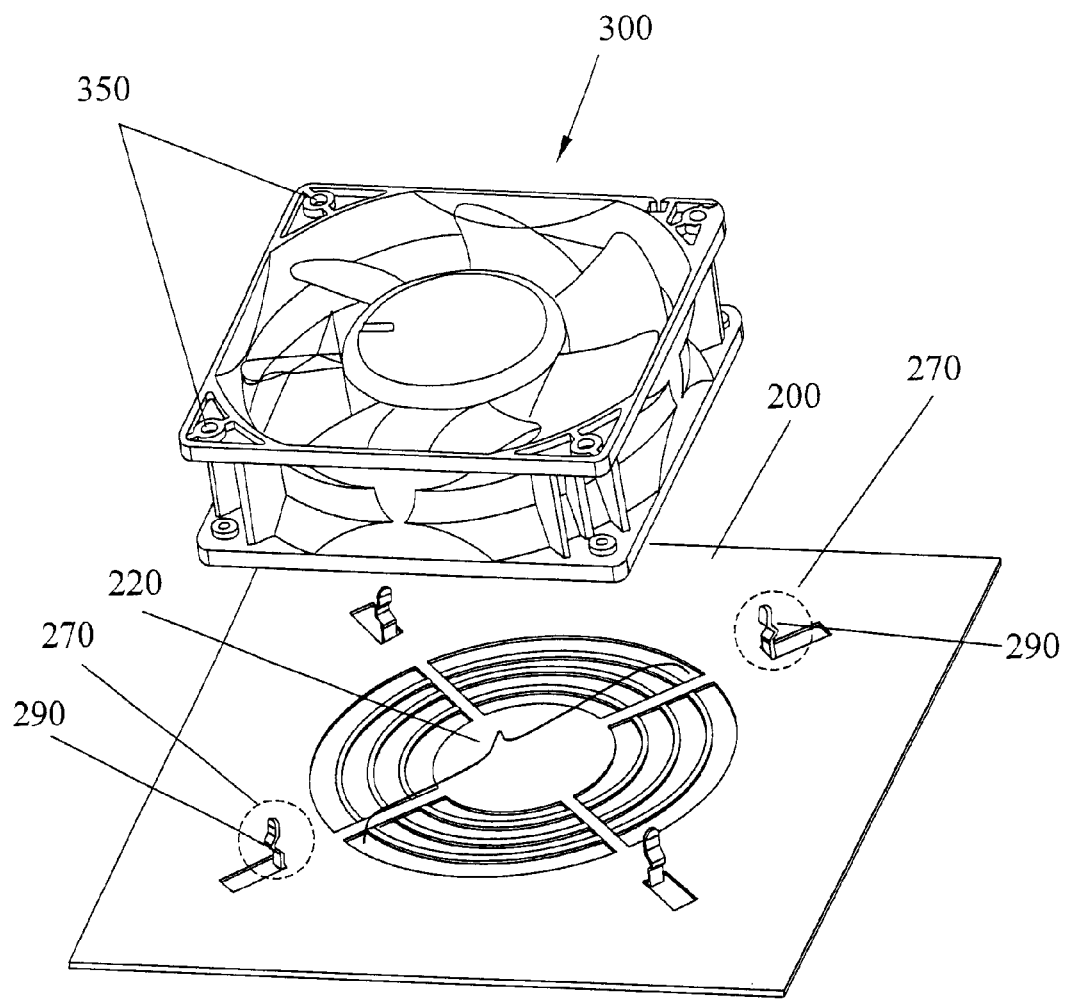
FIG. 4 shows another embodiment of the fan tray according to the present invention.

According to the third embodiment of the present invention shown in FIG. 4, the hot swap fan tray includes a frame 200 and at least one fan 300. Among these, the frame 200 includes at least one railing-shaped opening 220 and a plurality of protrusions 270. The fan 300 includes a plurality of holes 350, such as the holes 350 formed on the periphery of the fan 300. Besides, the present invention does not require the specific fan. That is, a general fan already in existence may be used as the present fan 300 to reduce cost.

As shown in FIG. 4, since the railing-shaped opening 220 is an opening having a plurality of railings, the railing-shaped opening 220 can serve as a fan guard. Both of the railing-shaped opening 220 and the protrusions 270 are formed by punching the frame 200. The protrusions 270 are arranged around the railing-shaped opening 220 and vertically project from the frame 200. Each of the protrusions 270 includes an bend 290. Due to the bend 290, the protrusions 270 can return to original shape elastically after compressed. During assembling, the bend 290 of the protrusions 270 passes through the hole 350, thereby the bend 530 attaching the fan 300 to the frame 200. Besides, the inlet or outlet of the fan 300 is aligned to the opening 220 of the frame 200.

As stated above, the present fan tray and fan guard is hot-swappable. Besides, the present invention does not require any screw attaching the fan and the fan guard to the frame of the fan tray.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A hot swap fan tray, comprising:
   a frame, further comprising:
      at least one railing-shaped opening;
      a plurality of protrusions, each of said protrusions integrally formed thereon by bending and having an elastic bend; and
   at least one fan, having a plurality of holes;
   wherein said protrusion passes through said hole, thereby said bend attaching said frame to said fan.

2. A hot swap fan guard, comprising:
   a fan guard plane, formed by sheet-metal forming processes; and
   at least one protrusive terminal, projecting from said fan guard plane, said protrusive terminal integrally formed on the fan guard plane by bending and including at least one elastic bend.

3. The hot swap fan guard according to claim 2, further coupled to a hole of a fan by means of said bend.

4. The hot swap fan tray according to claim 3, wherein said bend returns to original shape after passing through said hole.

5. The hot swap fan tray according to claim 2, wherein each of said bends is formed by bending said protrusive terminals toward identical directions.

6. The hot swap fan tray according to claim 2, further comprises a plurality of bends.

7. The hot swap fan tray according to claim 2, wherein said first bend and said second bend are continuous or discontinuous to each other.

8. The hot swap fan tray according to claim 2, wherein each of said bends is formed by bending said protrusive terminals towards different directions.

* * * * *